US009263606B2

(12) United States Patent
Ogawa

(10) Patent No.: US 9,263,606 B2
(45) Date of Patent: Feb. 16, 2016

(54) PHOTOELECTRIC CONVERSION ELEMENT AND PHOTOELECTRIC CONVERSION ELEMENT ARRAY

(71) Applicant: Shimpei Ogawa, Tokyo (JP)

(72) Inventor: Shimpei Ogawa, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 290 days.

(21) Appl. No.: 13/783,537

(22) Filed: Mar. 4, 2013

(65) Prior Publication Data

US 2013/0234006 A1    Sep. 12, 2013

(30) Foreign Application Priority Data

Mar. 6, 2012 (JP) .................. 2012-049026
Jan. 21, 2013 (JP) .................. 2013-008007

(51) Int. Cl.
*H01L 31/00*       (2006.01)
*H01L 31/0232*     (2014.01)
*G01J 1/44*        (2006.01)
*G01J 1/42*        (2006.01)
*B82Y 20/00*       (2011.01)
*H01L 31/09*       (2006.01)

(52) U.S. Cl.
CPC ........... *H01L 31/02327* (2013.01); *B82Y 20/00* (2013.01); *G01J 1/42* (2013.01); *G01J 1/44* (2013.01); *H01L 31/09* (2013.01)

(58) Field of Classification Search
CPC .................. G01V 8/20; B82Y 20/00
See application file for complete search history.

(56) References Cited

U.S. PATENT DOCUMENTS

| 5,685,919 | A | 11/1997 | Saito et al. |
| 8,653,431 | B2* | 2/2014 | Ogawa .................. 250/208.1 |
| 2012/0068049 | A1 | 3/2012 | Ogawa |

FOREIGN PATENT DOCUMENTS

| JP | 59-108376 A | 6/1984 |
| JP | 8-264821 | 10/1996 |
| JP | 2007-303927 A | 11/2007 |
| JP | 2012-83336 | 4/2012 |

OTHER PUBLICATIONS

U.S. Appl. No. 14/259,324, filed Apr. 23, 2014, Ogawa, et al.
Office Action issued Aug. 11, 2015 in Japanese Patent Application No. 2013-008007 (with English language translation).

* cited by examiner

*Primary Examiner* — Tony Ko
(74) *Attorney, Agent, or Firm* — Oblon, McClelland, Maier & Neustadt, L.L.P.

(57) ABSTRACT

A photoelectric conversion element which converts incident light to an electrical signal and detects the signal, the element including: a lower electrode; an insulating layer, provided on the lower electrode; a light-receiving section, which is provided on the insulating layer and receives incident light on the surface; and a groove-like slit, provided such that the insulating layer is exposed from a surface of the light-receiving section, wherein the incident light is converted by the slit to surface plasmons which are wave-guided along the insulating layer, and the surface plasmon is detected as an electrical signal between the light-receiving section and the lower electrode.

17 Claims, 13 Drawing Sheets

PHOTOELECTRIC CONVERSION ELEMENT AND PHOTOELECTRIC CONVERSION ELEMENT ARRAY

BACKGROUND OF THE INVENTION

1. Field of the Invention

The present invention relates to a photoelectric conversion element for converting light to an electrical signal through plasmonics, and a photoelectric conversion element array using the photoelectric conversion element.

2. Description of Related Art

As for photoelectric conversion elements formed by use of the conventional photoelectric conversion technology, elements using semiconductor band gaps, such as a photodiode and a quantum infrared sensor, have been in the mainstream, but these elements cannot possess optical resolution exceeding optical diffraction limits. For example, in the case of applying a semiconductor photoelectric conversion element to a sensor, there has been occurred a problem of detection limits due to the optical diffraction limits. As opposed to this, there has been proposed a photoelectric conversion element that converts surface plasmons without the diffraction limits to a current (JP 08-264821, A).

SUMMARY OF THE INVENTION

However, in order to excite surface plasmons, light needs to be incident on the surface of the photoelectric conversion element at a predetermined angle, and a prism for this purpose has thus been required. Especially in the case of using the photoelectric conversion element for an image sensor, most of incident light is vertically incident on the surface of the photoelectric conversion element, and there has thus been a problem in that the incident light does not excite surface plasmons.

Accordingly, an object of the present invention is to provide a photoelectric conversion element capable of exciting surface plasmons even with respect to vertical incident light without using a prism or the like.

That is, the present invention is a photoelectric conversion element which converts incident light to an electrical signal and detects the signal, the element including: a lower electrode; an insulating layer, provided on the lower electrode; a light-receiving section, which is provided on the insulating layer and receives incident light on the surface; and 4) a groove-like slit, provided such that the insulating layer is exposed from the surface of the light-receiving section, wherein the incident light is converted by the slit to surface plasmons which are wave-guided along the insulating layer, and the surface plasmons are detected as an electrical signal between the light-receiving section and the lower electrode.

Further, the present invention is used for an image sensor, position detecting, multi-wavelength detecting, and the like, wherein a plurality of photoelectric conversion elements are arranged in a matrix form and the detected electrical signal is read by a read circuit from the photoelectric conversion element.

As described above, in the photoelectric conversion element according to the present invention and the image sensor using this, surface plasmons can be generated by the slit structure even with respect to vertical incident light, and incident light can thus be detected by the simple structure without diffraction limits.

DETAILED DESCRIPTION OF THE PREFERRED EMBODIMENTS

Embodiment 1

Figure 1:
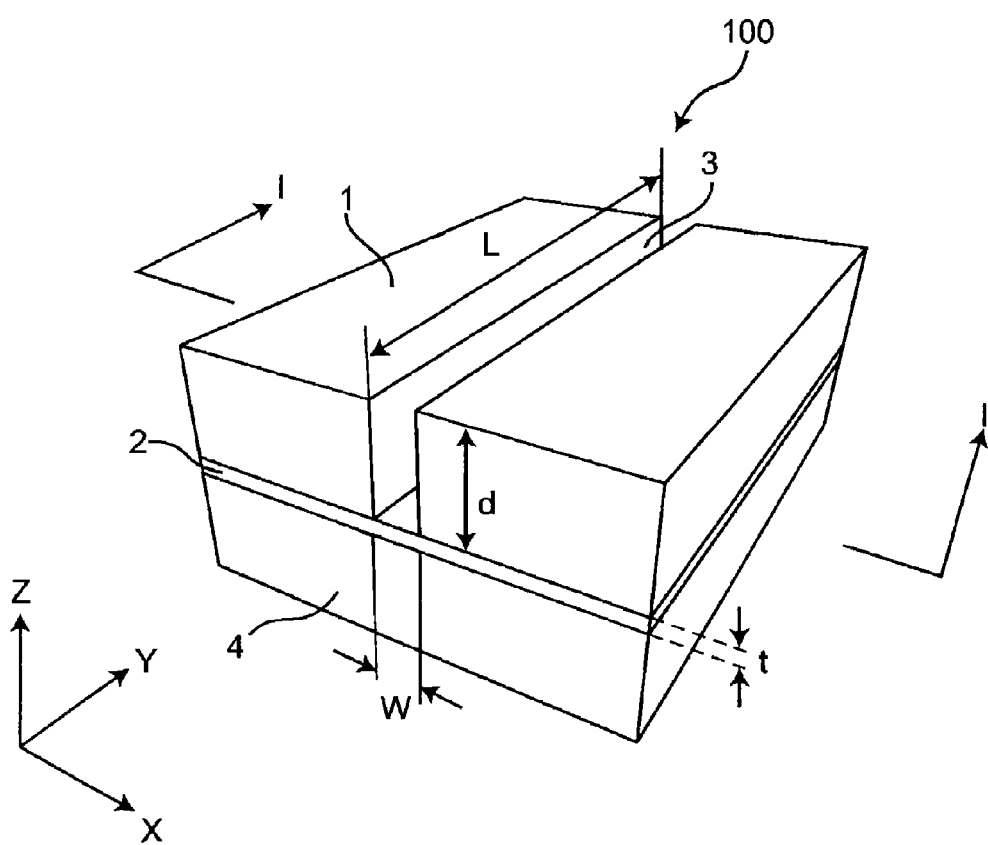
FIG. 1 is a perspective view of a photoelectric conversion element according to Embodiment 1 of the present invention.
Figure 2:
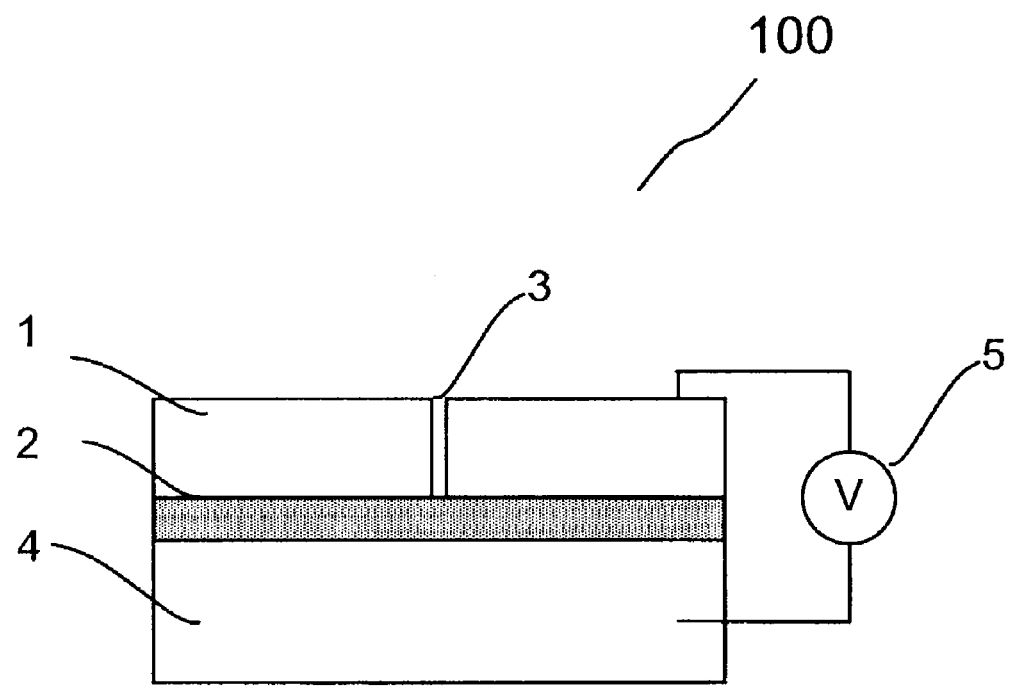
FIG. 2 is a sectional view of the photoelectric conversion element according to Embodiment 1 of the present invention.

FIG. 1 is a perspective view of a photoelectric conversion element according to Embodiment 1 of the present invention, which is as a whole denoted by numeral 100, and FIG. 2 is a sectional view of the photoelectric conversion element 100 of FIG. 1 when viewed in an I-I direction (plane vertical to a slit-length direction).

The photoelectric conversion element 100 has a lower electrode 4, and a light-receiving section 1 is provided on the lower electrode 4 via an insulating layer 2. The light-receiving section 1 is provided with a slit 3 such that the lower-level insulating layer 2 is exposed. The light-receiving section 1 and the lower electrode 4 are made of metal, which is metal capable of exciting surface plasmons or metal having a high reflectivity in a target wavelength region, such as gold, silver, aluminum, copper, chromium or nickel, and an appropriate material is selected in accordance with a production method, or the like. The insulating layer 2 is formed of a thermally-oxidized film or the like, which is for example made of silicon oxide ($SiO_2$), silicon nitride ($SiN_x$), hydrogen silsesquioxane (HSQ), titanium oxide (TiO), nickel oxide (NiO), aluminum oxide ($Al_2O_3$), or the like. The underside of the lower electrode 4 is held by a substrate for holding (not shown), or the like. Further, the substrate may be provided with a circuit for reading a voltage or reading a current. At least either the bottom surface or part of the side surface of the slit 3 is directly connected to the insulating layer. An electrical signal to be detected may be either a voltage or a current. Hereinafter, the case of detecting a voltage will mainly be described.

As shown in FIGS. 1 and 2, the light-receiving section 1 is provided with the groove-like slit 3 extending in a predetermined direction (Y-direction in FIG. 1). The slit 3 preferably has a width w of several hundred nm and a depth d of not larger than 5 μm. The width w and the depth d of the slit are set so as to give the maximum coupling efficiency in accordance with a wavelength wished to be detected. The slit 3 is formed in such a manner that, after formation of a resist layer on the light-receiving section 1, a resist mask is formed by lithography using electron beam drawing or by nanoimprinting, and the light-receiving section 1 is etched by ion-beam etching or FIB by use of the resist mask. Alternatively, the slit may be formed in such a manner that the slit portion is formed of the resist material while the other portion is formed by plating or the like, and the resist material is subsequently removed.

The photoelectric conversion element 100 further has a voltage detecting section 5 for measuring a voltage between the light-receiving section 1 and the lower electrode 4. A current detecting section may be provided in place of the voltage detecting section 5.

Next, an operation principle of the photoelectric conversion element 100 will be described.

First, a photoelectric conversion element without the slit 3 (the case of the light-receiving section 1 not having the slit 3 in FIG. 2) will be considered. It is assumed that light propagates through a medium I (vacuum) and is incident on a medium II (light-receiving section 1), and the light is then converted to surface plasmons on a boundary surface therebetween. Generally, the following relation holds when an angular frequency of the incident light is ω, a wave number is k, a wave number of a surface plasmon propagating direction is $k_x$, a speed of light in the vacuum is c, a dielectric constant of the medium 1, through which light propagates, is $\varepsilon_1$, a refractive index is n, a dielectric constant of a medium 2, on which light is incident, is $\varepsilon_2$, and an incident angle (angle formed between a normal to the incident surface and the incident light):

$$k_x = \frac{\omega}{c}\left(\sqrt{\frac{\varepsilon_1 \varepsilon_2}{\varepsilon_1 + \varepsilon_2}}\right) \quad \text{(Formula 1)}$$

However, when the dielectric constant is a complex dielectric constant, the following holds:

$$R(k_x) = \frac{\omega}{c} R\left(\sqrt{\frac{\hat{\varepsilon}_1 \hat{\varepsilon}_2}{\hat{\varepsilon}_1 + \hat{\varepsilon}_2}}\right) \quad \text{(Formula 2)}$$

However, the dielectric constant $\hat{\varepsilon}_1 \hat{\varepsilon}_2$ is a normalized dielectric constant, and the inside of parentheses of R represents a real part in the parentheses.

Since a factor in this dispersion relation does not agree with that in the following formula representing the dispersion relation in the vacuum:

$$k = \frac{\omega}{c} \quad \text{(Formula 3)}$$

and hence it is found that this plasmon resonance does not occur in the vacuum.

As opposed to this, when an evanescent wave having a closer dispersion relation is used, plasmon resonance occurs, thereby to allow excitation of surface plasmons. Herein, the dispersion relation of the evanescent wave is expressed by:

$$k = \frac{\omega}{c} n \sin\theta \quad \text{(Formula 4)}$$

Accordingly, conditions for exciting surface plasmons can be expressed by the following formula from (Formula 3) and (Formula 4):

$$\sin\theta = \frac{1}{n}\left(\sqrt{\frac{\varepsilon_1 \varepsilon_2}{\varepsilon_1 + \varepsilon_2}}\right) \quad \text{(Formula 5)}$$

Figure 3:
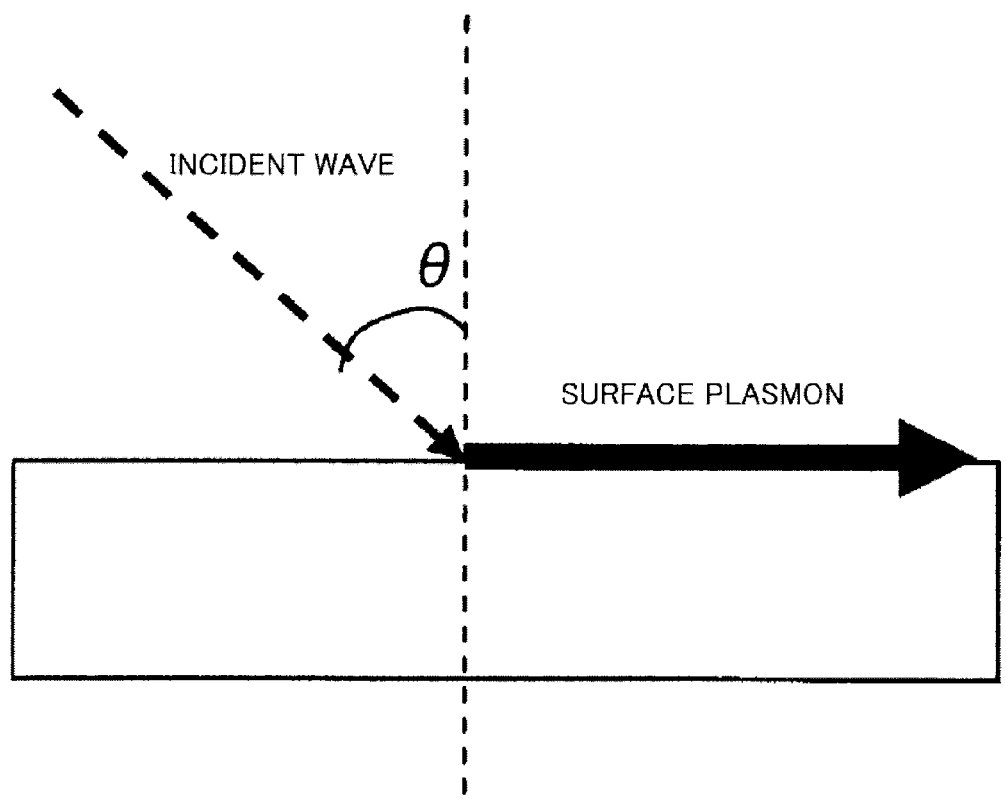
FIG. 3 is a schematic view of a light-receiving section in the case of no slit being provided, for explaining a principle of Embodiment 1 of the present invention.

That is, exciting surface plasmons requires adjustment of the incident angle θ such that (Formula 5) holds for matching (surface plasmon resonance). Therefore, in JP 08-264821, A above, strong dependency on the incident angle appears with regard to excitation of surface plasmons. That is, in the case of using a flat structure without a slit as shown in JP 08-264821, A, surface plasmons are hardly generated with respect to vertical incident light. For this reason, adjustment of the incident angle θ by use of a prism or the like is required. For example, in FIG. 3, the incident angle θ is adjusted such that an incident direction becomes an oblique direction (direction indicated by a thick broken line) so as to make the condition (Formula 5) for exciting surface plasmons hold.

Next, the photoelectric conversion element 100 having the slit 3 according to present Embodiment 1 will be described. Herein, when a slit width of the slit 3 is w, a depth thereof is d and a wavelength of an incident wave to be detected is λ, w is at least not larger than the order of λ/2. In this case, since higher-order diffracted light is not generated, the incident wave forms a waveguide mode that strongly resonates within the slit 3. Further, a reflected wave that is reflected from the slit becomes a pseudo cylindrical wave with the slit at the center.

Figure 4:
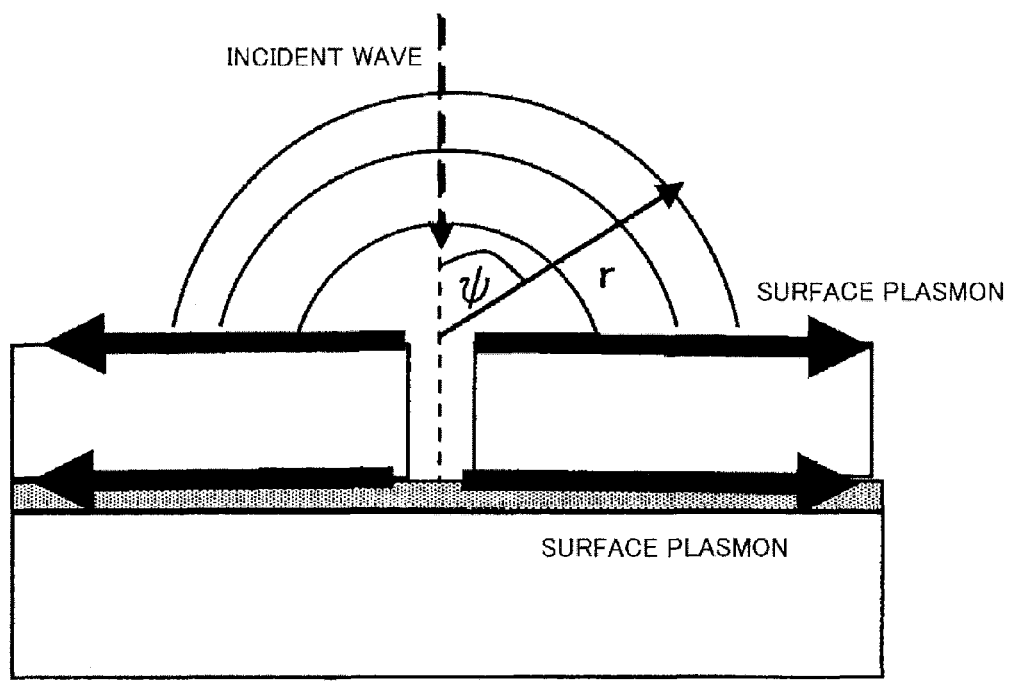
FIG. 4 is a schematic view of a light-receiving section in the case of a slit being provided, for explaining the principle of Embodiment 1 of the present invention.

In the case of the reflected wave being the cylindrical wave, as shown in FIG. 4, when it is expressed by use of a cylindrical coordinate system where the slit 3 is centered and a distance from the slit 3 is taken as r, the reflected wave is expressed by the following formula with respect to every direction ψ, where r is sufficiently large and A is a constant:

$$\frac{A}{\sqrt{r}} \exp ikr \quad \text{(Formula 6)}$$

That is, part of vertical incident light is converted by the slit 3 to a cylindrical wave with a component of ψ=90° (parallel to the surface of the light-receiving section 1). Since the surface of the light-receiving section 1 has a wave number component $k_x$, on the surface of the light-receiving section 1 at each end of the slit 3, the wave-number matching (plasmon resonance) relation shown in (Formula 1) is satisfied. As thus described, by forming the slit 3 with the slit width d on the surface of metal, it is possible to overcome the mismatch relation of (Formula 5) even with respect to vertical incident light (θ=0), so as to make coupling between the wave number k of incident light and a surface plasmon mode. A similar phenomenon also occurs on the insulating layer 2 where light coupled with the slit 3 is converted to surface plasmons and then wave-guided.

As thus described, providing the slit 3 in the light-receiving section 1 allows conversion of light vertically incident on the surface of the light-receiving section 1 to electromagnetic waves (surface plasmons or surface plasmon-polaritons) that propagate along the surface. This eliminates the need of a prism for adjusting the incident angle θ, which has been required in the structure without a slit. Further, surface plasmons are wave-guided to the insulating layer 2 by the slit 3. Since the lower electrode 4 and the light-receiving section 1 are both made of metal, the converted surface plasmons are confined in the insulating layer 2, and an electromagnetic field of propagating waves (surface plasmons) is localized. That is, the localized electric field is generated between the light-receiving section 1 and the lower electrode 4. By measuring a voltage or a current generated by this electric field, incident light can be detected. The combination of the metal, the insulating layer and the metal has a rectifying action for acting as a kind of diode due to a tunnel effect, thereby allowing extraction of a direct current signal. Further, a bias voltage may be applied to between the light-receiving section 1 and the lower electrode 4. Applying the bias voltage can lead to an increase in output voltage or current.

Further, for enhancing the propagation efficiency in the propagation of surface plasmons as thus described, the top surface of the insulating layer 2 and the undersurface thereof (top surface of the lower electrode 4 which is in contact with the insulating layer 2) are preferably flat.

In the case of the slit 3 not being provided, a wavelength at which the surface plasmon conversion efficiency reaches its maximum is decided in accordance with a dielectric constant specific to metal, but by providing the slit 3, it is possible to control a wavelength for conversion to surface plasmons by means of a structure parameter of the slit 3.

Herein, the surface plasmon originally refers to the surface plasmon-polariton in the meaning of oscillation of metal free electrons, and has a phenomenon of wavelengths in the visible light region to the near-infrared light region. However, by providing the slit 3 as in the photoelectric conversion element 100 according to Embodiment 1 of the present invention, a propagated wave is generated which propagates along the insulating layer 2 even at a longer wavelength than that of near-infrared light, e.g., infrared light, thereby allowing generation of an electric field in s direction parallel to the slit depth (direction of thick arrows in FIG. 4) between the light-receiving section 1 and the lower electrode 4. This as a result allows detection of an electromagnetic field that propagates along the insulating layer 2 even in the infrared light, similarly to the inherent detection of surface plasmons. Accordingly, herein, not only the inherent electromagnetic field that is generated in visual light to near-infrared light but also the electromagnetic field that is generated in infrared light due to the effect of the slit 3 and propagates along the insulating layer 2 is expressed as the surface plasmon without any particular distinction therebetween.

In the photoelectric conversion element 100 according to Embodiment 1 of the present invention, a detection wavelength and detection efficiency are decided in accordance with the width w and the depth d of the slit 3 and a thickness t of the insulating layer 2.

In order to form surface plasmons within the insulating layer 2, the width w of the slit 3 is preferably not larger than a half of the detection wavelength in the visible light region to the near-infrared light region, which maximizes the conversion efficiency. For example, in a case where the light-receiving section 1 is made of silver, the slit depth d is 3 μm and a wavelength of incident light is 600 nm, as a result of analysis by the FDTD (Finite Difference Time Domain) method, the slit width w to give the maximum coupling efficiency (surface plasmon conversion) is the order of 250 to 300 nm.

For example, in a case where light with a wavelength of 5 μm as infrared light is incident, as a result of analysis by the FDTD method, the surface plasmon conversion efficiency reaches its maximum with the width of the slit 3 being the order of 300 to 400 nm and the depth d thereof being about 1 μm Further, in a case where light with a wavelength of 3 μm is incident, as a result of analysis by the FDTD method, the surface plasmon conversion efficiency reaches its maximum with the width of the slit 3 being the order of 200 to 300 nm and the depth d thereof being about 0.5 μm.

As thus described, changing the depth d of the slit 3 leads to a change in wavelength to be detected. Hence, the propagated wave to be generated on the insulating layer 2 can be selected by means of resonance in the depth direction of the slit 3.

Figure 5A:
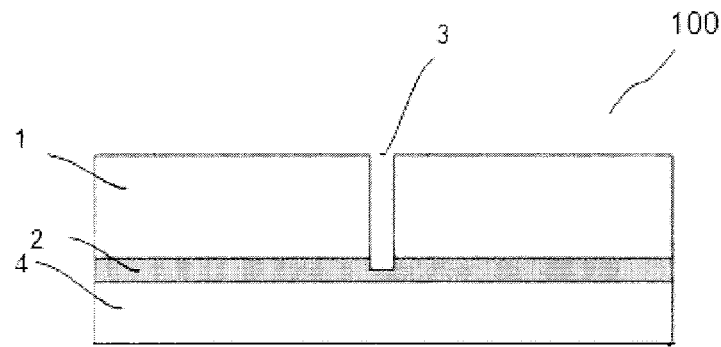
FIG. 5A is a sectional view of another photoelectric conversion element according to Embodiment 1 of the present invention.
Figure 5B:
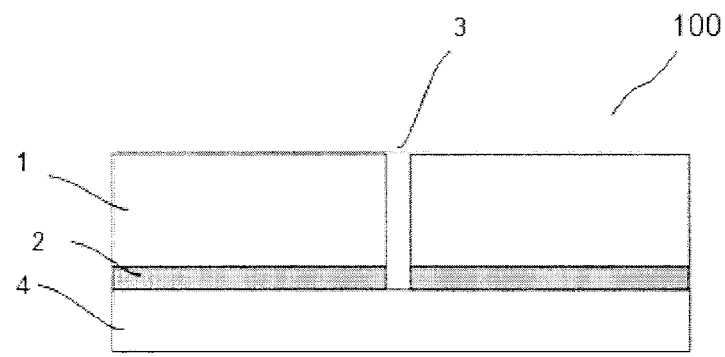
FIG. 5B is a sectional view of another photoelectric conversion element according to Embodiment 1 of the present invention.
Figure 5C:
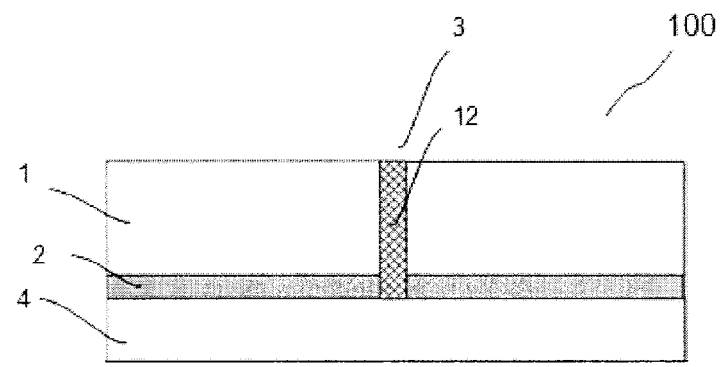
FIG. 5C is a sectional view of another photoelectric conversion element according to Embodiment 1 of the present invention.

It should be noted that, FIGS. 5A to 5C are sectional views of another photoelectric conversion element according to Embodiment 1 of the present invention. As shown in FIG. 5A, the bottom surface of the slit 3 may be located between the top surface and the undersurface of the insulating layer 2. Further, as shown in FIG. 5B, the slit 3 may pass through the insulating layer 2, to reach the lower electrode 4. Also in this case, when the width of the slit is as fine as described above, surface plasmons are generated and propagate along the insulating layer 2. With the insulating layer 2 being very thin, in production of the slit 3, the slit 3 is easier to produce when having a structure where its bottom does not agree with the top surface of the insulating layer 2.

Further, as apparent from the foregoing principle formulas, even when the inside of the slit 3 is filled with an insulating material, a dielectric material or a semiconductor material as a filling 12 as in FIG. 5C, surface plasmon conversion occurs. When the filling 12 is provided, an effective light wavelength inside the slit 3 becomes long, and hence in the conversion structure with respect to a predetermined wavelength, the height of the slit 3 becomes small and the width thereof becomes large as compared with the case without the filling 12. That is, as compared with the case of not providing the filling 12 inside the slit 3, an aspect ratio of the slit 3 (depth of the slit 3/width of the slit 3) becomes small, which facilitates production thereof. In addition, the slit 3 may be filled with the same insulating material as the insulating layer 2.

The film thickness of the insulating layer 2 is on the order of several to 200 nm, and the film thickness is optimized by means of the material for the insulating layer and the detection wavelength. Further, the wavelength for conversion to surface plasmons can also be controlled by the thickness t of the insulating layer 2. Considering from a result of analysis, the thickness t of the insulating layer 2 is preferably not larger than 50 nm.

As thus described, in the photoelectric conversion element 100 according to Embodiment 1 of the present invention, even light vertically incident on the surface can be converted to surface plasmons (or surface plasmon-polaritons) that propagate along the insulating layer 2, thereby eliminating the need of a prism or the like for adjusting the incident angle θ, and simplifying the structure of the photoelectric effect element. Further, also as for infrared light, surface plasmons propagating along the insulating layer 2 can be electrically detected.

Moreover, the detection wavelength can be selected by means of the width and the depth d of the slit 3 and the thickness t of the insulating layer 2.

Figure 6:
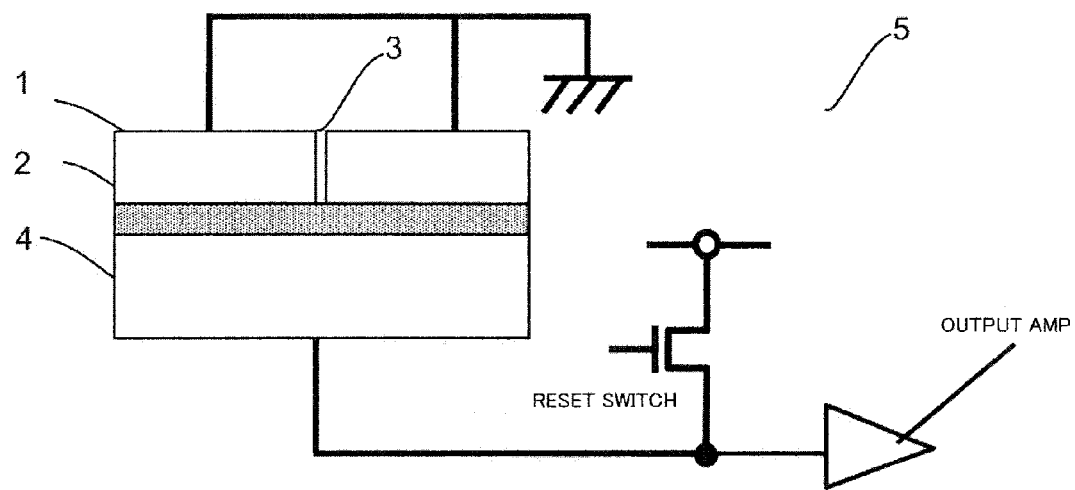
FIG. 6 is a schematic view of an electrical-signal read circuit of the photoelectric conversion element according to Embodiment 1 of the present invention.

Finally, the voltage detecting section 5 will be described. For example as shown in FIG. 6, the voltage detecting section 5 is made up of a circuit where the surface of the light-receiving section 1 is used as a ground potential, a read circuit (integration circuit in FIG. 6) is connected to the bottom of the lower electrode 4, and an output is read in units of voltage. Conversely, the lower electrode 4 may be used as the ground potential. With such a configuration, the electric field due to surface plasmons generated on the insulating layer 2 can be extracted as an integrated signal, and hence the signal intensity can be made high.

In addition, in the case of forming a special structure, e.g. a slit or a fine projection, in the lower electrode 4 and measuring a potential difference of surface plasmons generated in that portion, since the underside of the lower electrode 4 is not flat, it is difficult to mount the photoelectric conversion element on the substrate or the like. Further, the voltage detecting section 5 (electrical-signal read circuit) needs to be formed on the underside of the lower electrode 4, which not only makes connection to the flat substrate difficult, but also makes connection with the voltage detecting section 5 itself difficult.

In the method for detecting a voltage between the light-receiving section 1 and the lower electrode 4 as in Embodiment 1 of the present invention, the read electric circuit can be formed within the same plane as the photoelectric conversion element 100, which thus facilitates mounting of the circuit on the substrate, and is also suitable for integration.

Herein, the surface of the lower electrode 4 is preferably flat. The surface being flat facilitates connection of the electric circuit, and also facilitates arrangement in a matrix form (array form) as described later.

Embodiment 2

Figure 7:
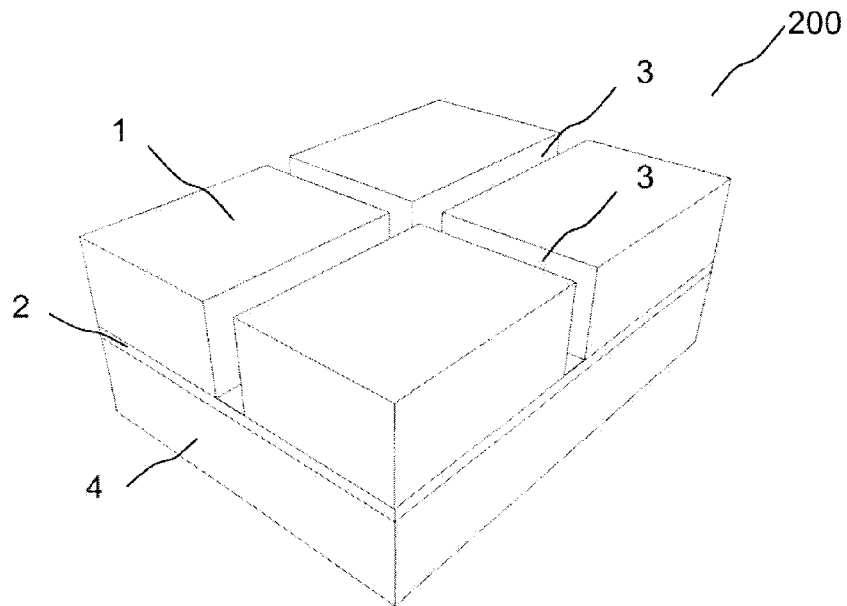
FIG. 7 is a perspective view of a photoelectric conversion element according to Embodiment 2 of the present invention.

FIG. 7 is a perspective view of a photoelectric conversion element according to Embodiment 2 of the present invention, which is as a whole denoted by numeral 200. In FIG. 7, the same numerals as in FIGS. 1 and 2 denote the same or corresponding parts.

The photoelectric conversion element 200 is structured such that, in addition to the slit 3 as in Embodiment 1, another slit 3 is provided in a vertical direction thereto (X-direction in FIG. 1). Except for the slit 3, the structure is the same as that of the photoelectric conversion element 100 according to Embodiment 1 described above.

In the case of the single slit 3, there is polarization dependency on the direction of the slit. However, when the two orthogonal slits 3 as shown in FIG. 7 are used, all vertical incident light components are resolved into two orthogonal directions (corresponding to the two orthogonal slits), and hence surface plasmon conversion by means of the two orthogonal slits 3 can be performed even with respect to incident light having all polarized components. That is, forming two slits 3 so as to be orthogonal to each other allows conversion to surface plasmons without depending on polarization of the incident light, thereby making an electrical signal output large. Further, as in the photoelectric conversion element 100 according to Embodiment 1, by adjusting the width and the height of the slit 3 and the thickness of the insulating layer, the detection wavelength can be controlled.

Embodiment 3

Figure 8:
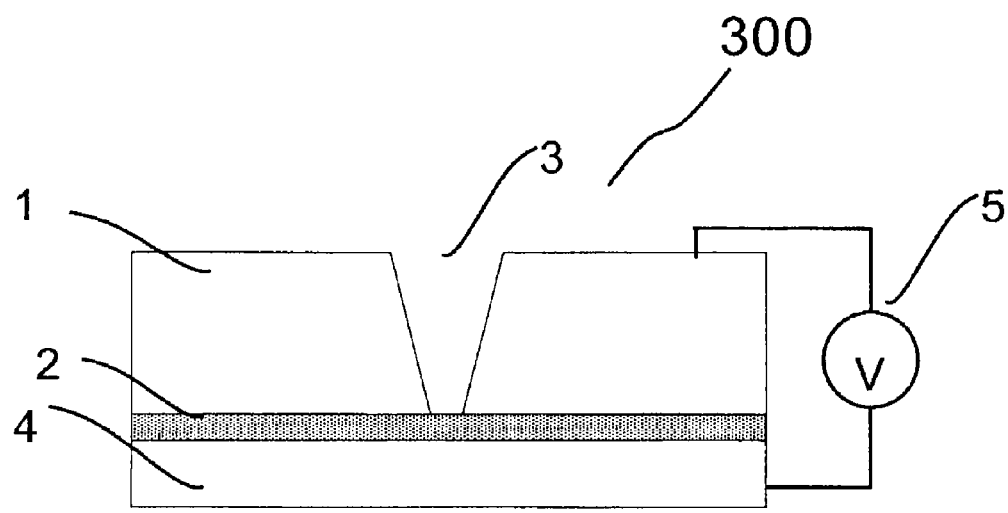
FIG. 8 is a sectional view of a photoelectric conversion element according to Embodiment 3 of the present invention.

FIG. 8 is a sectional view of a photoelectric conversion element according to Embodiment 3 of the present invention, which is as a whole denoted by numeral 300, showing a cross section thereof when viewed in the same direction as the I-I direction of FIG. 1. In FIG. 8, the same numerals as in FIGS. 1 and 2 denote the same or corresponding parts.

As seen from FIG. 8, in the photoelectric conversion element 300, the cross section of the slit 3 is in a V-shape (wedge shape) with a width being large at the top and gradually decreasing downward therefrom. The other structures are similar to those of the photoelectric conversion element 100.

In the photoelectric conversion element 300, the cross section of the slit 3 is made to have the wedge shape (V-shape), whereby the width w at the opening of the slit 3 can be similar to that of the photoelectric conversion element 100, and the width w at the bottom of the slit 3 can be smaller than that at the opening thereof. In such a structure, the electric field is localized in an extremely narrow space at the bottom of the slit 3, and the electric field is thus enhanced. For this reason, at the bottom of the slit 3, the intensity of the electric field at a wavelength for conversion to surface plasmons can be selectively enhanced. This can result in enhancement in coupling efficiency of the wavelength to surface plasmons.

Further, when a wall-surface inclined angle of the slit 3 (angle between a normal to the top surface of the insulating layer 2 and the wall surface of the slit) is φ, θ in (Formula 4) can be controlled by φ. Hence it is found that the conversion efficiency and the conversion wavelength to surface plasmons can be controlled by φ. It is also possible to select the detection wavelength by changing the shape (inclined angle φ of the wall surface) of the slit 3. Since the generation of surface plasmons is also controlled by φ on top of the height and the width of the slit 3, the detection wavelength can be more easily controlled.

Embodiment 4

Figure 9:
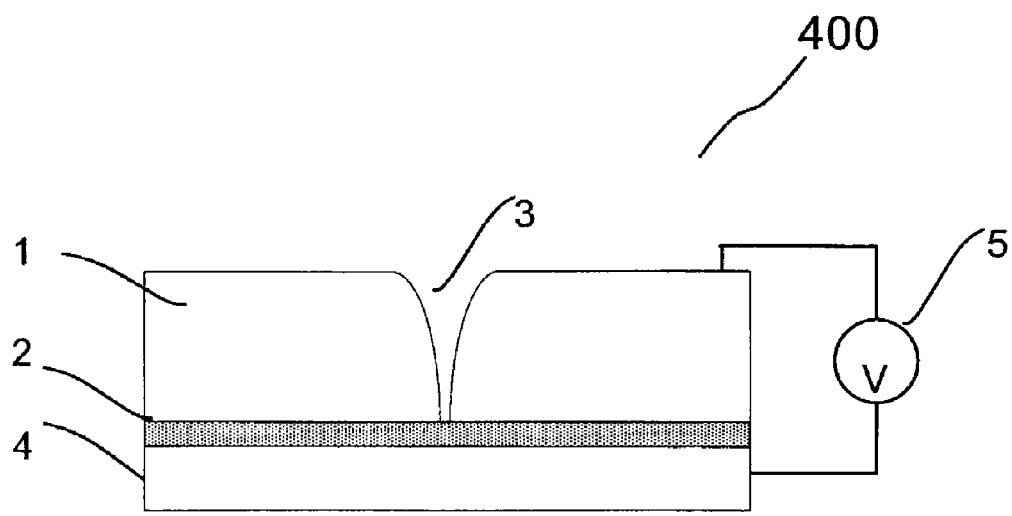
FIG. 9 is a sectional view of a photoelectric conversion element according to Embodiment 4 of the present invention.

FIG. 9 is a sectional view of a photoelectric conversion element according to Embodiment 4 of the present invention, which is as a whole denoted by numeral 400, showing a cross section thereof when viewed in the same direction as the I-I direction of FIG. 1. In FIG. 9, the same numerals as in FIGS. 1 and 2 denote the same or corresponding parts.

As seen from FIG. 9, in the photoelectric conversion element 400, the cross section of the slit 3 has a width which is large at the top and gradually decreases downward therefrom, and the wall surface is not a flat surface but a convex curved surface (curved structure) toward the inside of the groove. The other structures are similar to those of the photoelectric conversion element 100.

In the photoelectric conversion element 400, the wall surface of the slit 3 is not formed to be a flat surface as in the photoelectric conversion elements 100, 200, but formed to be a curved surface as shown in FIG. 9 to make the opening thereof wide, whereby incident light can be taken in from a wider range of directions. This can result in increase in intensity of an electrical signal to be detected, so as to enhance detection sensitivity.

Embodiment 5

Figure 10A:
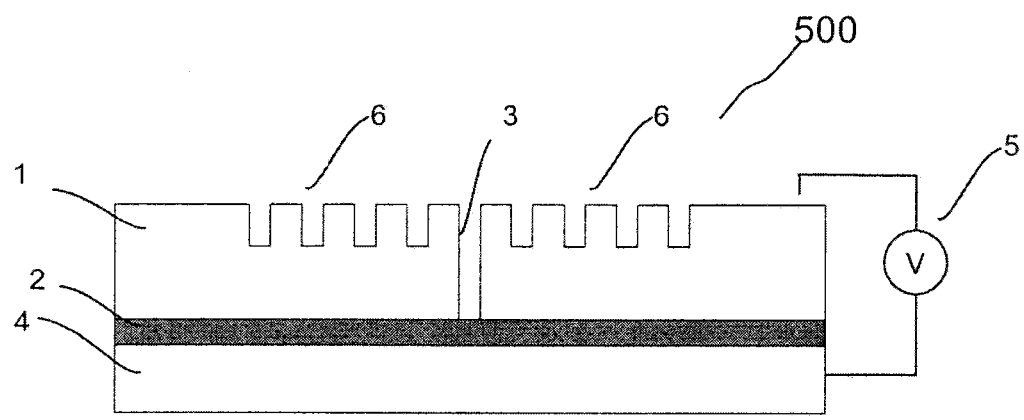
FIG. 10A is a sectional view of a photoelectric conversion element according to Embodiment 5 of the present invention.

FIG. 10A is a sectional view of a photoelectric conversion element according to Embodiment 5 of the present invention, which is as a whole denoted by numeral 500, showing a cross section thereof when viewed in the same direction as the I-I direction of FIG. 1. In FIG. 10A, the same numerals as in FIGS. 1 and 2 denote the same or corresponding parts.

In the photoelectric conversion element 500, the light-receiving section 1 has the slit 3, and also has a plurality of reflective slits 6 arranged parallel to the slit 3 (in a vertical direction to plane of the paper in FIG. 10A), on both sides of the slit 3. The other structures are similar to those of the photoelectric conversion element 100.

With the slit 3 at the center, the reflective slits 6 are provided on both sides thereof. A depth d of the reflective slit 6 is smaller than that of the slit 3, and a width w of the reflective slit 6 is almost the same as that of the slit 3. The reflective slit 6 is preferably provided in a plurality of number. In the case of periodically providing the reflective slits 6 (providing them at regular pitches with respect to a lateral direction of FIG. 10A), the period is preferably one comparable to the detection wavelength.

As thus described, when the periodic structure (periodic reflective slits 6) is provided on the surface of the light-receiving section 1, surface plasmons can be excited by ordinary incident light. That is, when a wave number vector of surface plasmons is $\vec{k}_{sp}$, a wave number vector of incident light is $\vec{k}_{inc}$, and a reciprocal lattice vector is $\vec{g}$, the following relation holds:

$$\vec{k}_{sp} = \vec{k}_{inc} + \vec{g}$$ (Formula 7)

For example, in the case of a one-dimensional periodic structure, such a relation as follows holds when a wave number of surface plasmons is $k_{sp}$, an wave number of the incident light is $k_0$ an incident angle (angle formed between a normal to the incident surface and the incident light) is θ, a period (pitch) of the structure is T, and m is an integer:

$$k_{sp} = k_0 \sin\theta + m \times \frac{2\pi}{T}$$ (Formula 8)

As apparent from (Formula 8), it is found that a mismatch in wave number is overcome by the periodic structure, and surface plasmons are excited even with respect to vertical incident light (θ=0), and coupled to the surface. Further, in the case of vertical incident light (θ=0), a wavelength of incident light which is excited on the surface is equivalent to a wavelength shown in (Formula 8). In particular, when vertical incidence is the main component, the wavelength is equivalent to the period.

Accordingly, by providing the reflective slits 6 with the periodic structure on the surface of the light-receiving section 1, the conversion efficiency for conversion to surface plasmons increases in light with a specific wavelength corresponding to the period, thereby to allow wavelength-selective detection. Further, by providing such reflective slits 6 as to satisfy (Formula 8), surface plasmons generated at the slit 3 on the side of the light-receiving surface of the light-receiving section 1 are reflected by the reflective slits 6 and guided to the insulating layer 2, consequently increasing the intensity of surface plasmons within the insulating layer 2.

Figure 10B:
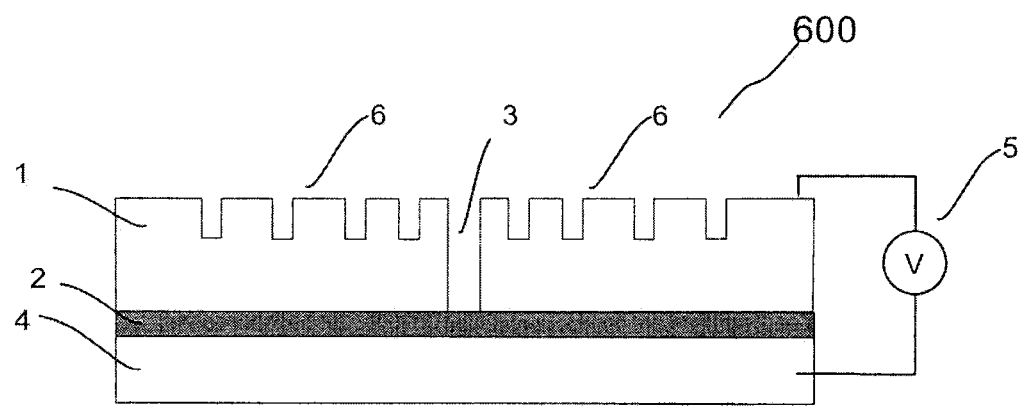
FIG. 10B is a sectional view of another photoelectric conversion element according to Embodiment 5 of the present invention.

FIG. 10B is a sectional view of another photoelectric conversion element according to Embodiment 5 of the present invention, which is as a whole denoted by numeral 600, where the same numerals as in FIG. 10A denote the same or corresponding parts. In the photoelectric conversion element of FIG. 10A, the reflective slits 6 are provided at regular pitches, whereas in the photoelectric conversion element of FIG. 10B, the reflective slits 6 are provided such that the pitch gradually gets wider with distance from the slit 3. The other structures are similar to those of the photoelectric conversion element of FIG. 10A.

In the photoelectric conversion element 600 of FIG. 10B, by the effect of the reflective slits 6, surface plasmons coupled to incident light are concentrated on the portion of the slit 3, and collected to the insulating layer 2. This makes the voltage, detected in the voltage detecting section 5, high as compared with that in the structure not having the reflective slits 6 but only having the slit 3, thus making the photoelectric conversion efficiency and the detection efficiency high.

Embodiment 6

Figure 11:
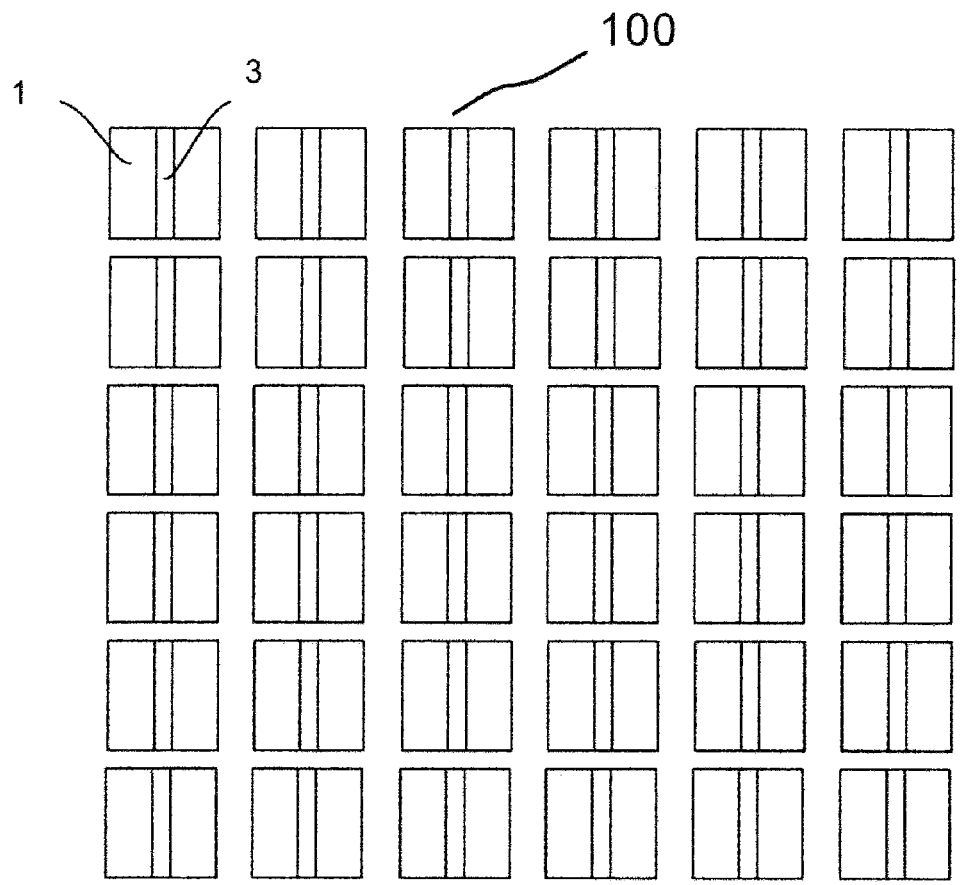
FIG. 11 is a plan view of a photoelectric conversion element array according to Embodiment 6 of the present invention.

FIG. 11 is a top view of a photoelectric conversion element array where the photoelectric conversion elements 100 according to Embodiment 1 are arranged in a matrix form (only the photoelectric conversion elements 100 are shown). Further, FIG. 12 is a sectional view of FIG. 11, having a structure where a read circuit section 7 is provided on a substrate 8, and the photoelectric conversion elements 100 is provided in the matrix form on the read circuit section 7.

Figure 12:
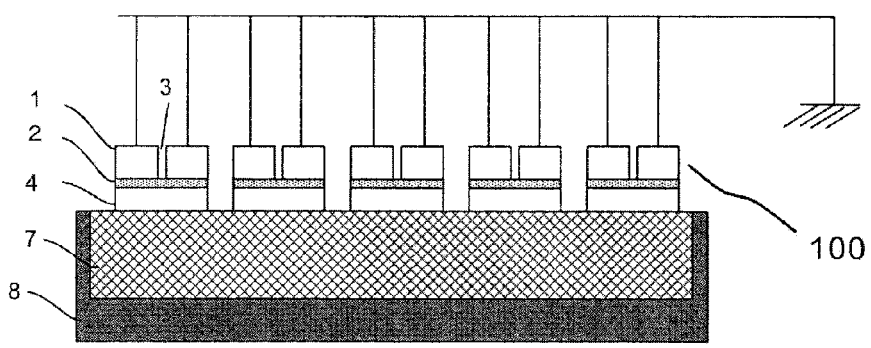
FIG. 12 is a sectional view of the photoelectric conversion element array according to Embodiment 6 of the present invention.

FIG. 12 is a sectional view in a case where the potential (earth potential here) on the surface of the light-receiving section 1 is made common among each photoelectric conversion element 100, and the signal read circuit 7 (voltage detecting section 5 including the integration circuit) is connected to the underside of the lower electrode 4. Providing the signal read circuit 7 below the lower electrode 4 eliminates the need of the space for forming the signal read circuit on the surface side, thereby to allow high-density integration.

Further, planarizing the bottom surface of the lower electrode 4 further facilitates integration on the substrate 8 as shown in FIG. 12, and also facilitates connection of the lower electrode 4, the read circuit section 7 and the substrate 8.

Figure 13:
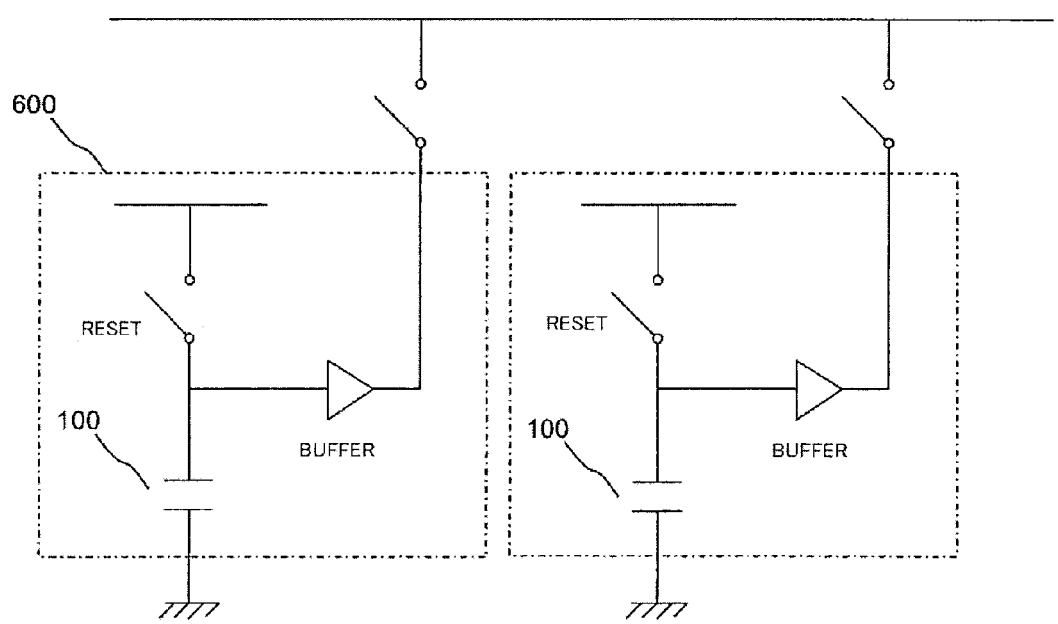
FIG. 13 is a schematic view of an electrical-signal read circuit of the photoelectric conversion element array according to Embodiment 6 of the present invention.

FIG. 13 is a schematic view of an electrical-signal read circuit of the photoelectric conversion element array according to Embodiment 6 of the present invention, showing an electrical-signal read circuit in a case where the photoelectric conversion element 100 is taken as a capacitor and unit pixels 600 are one-dimensionally arranged.

Figure 14:
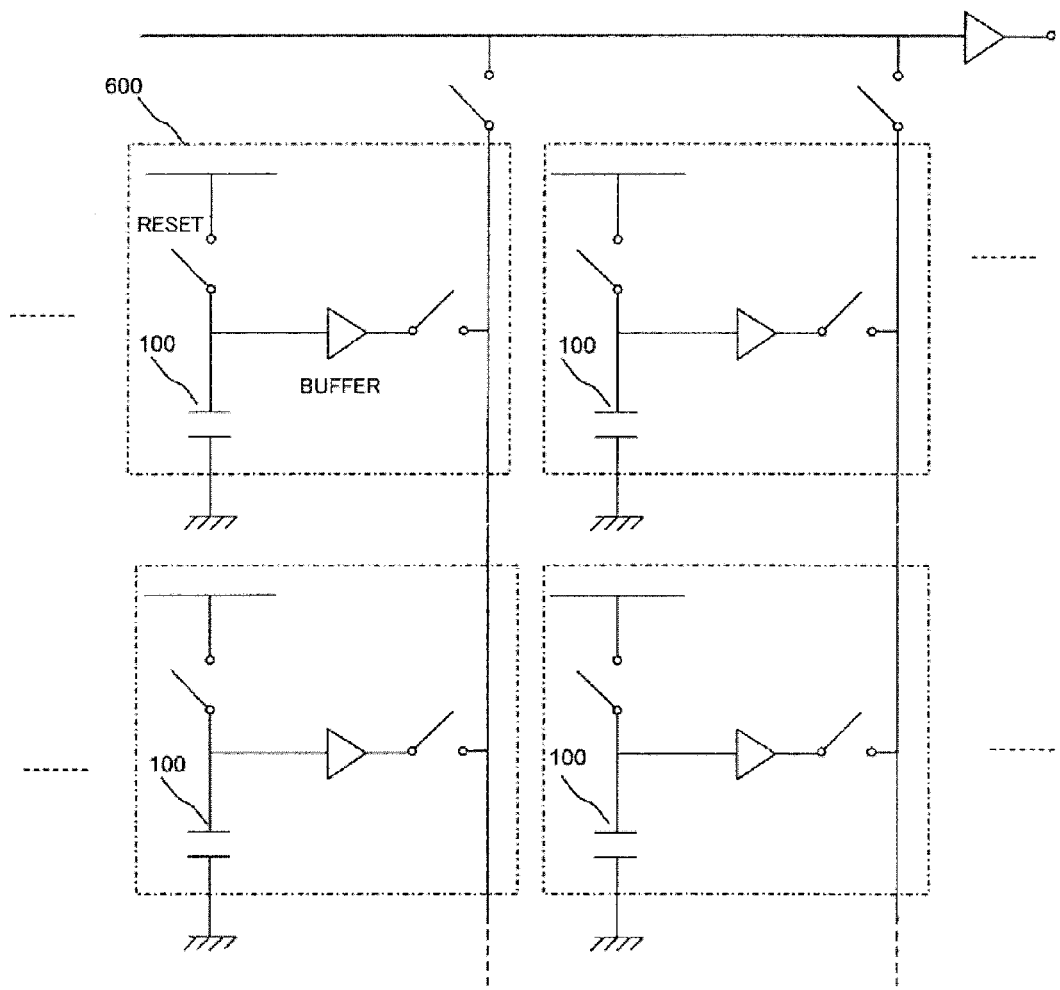
FIG. 14 is a schematic view of an electrical-signal read circuit of another photoelectric conversion element array according to Embodiment 6 of the present invention.

FIG. 14 is a schematic view of an electrical-signal read circuit of another photoelectric conversion element array according to Embodiment 6 of the present invention, showing an electrical-signal read circuit in a case where the unit pixels 600 are two-dimensionally arranged in a column direction and a row direction. Connecting the read circuit as thus described enables signal detection in the matrix form.

Figure 15A:
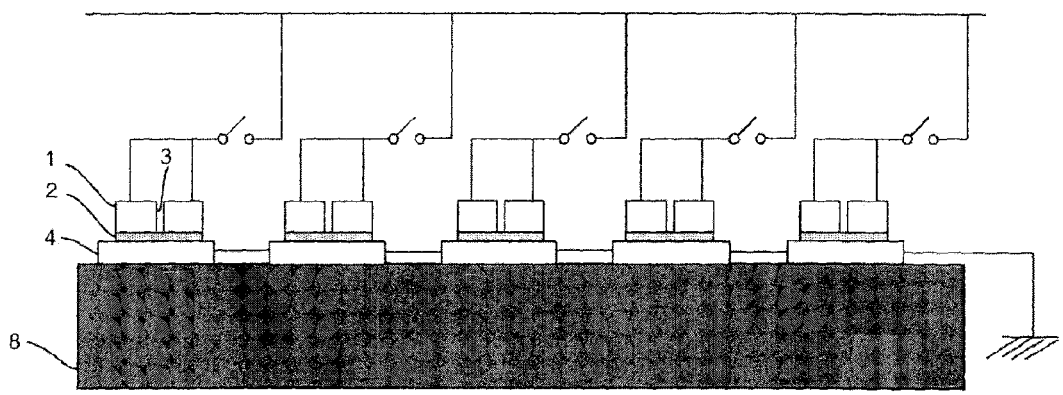
FIG. 15A is a sectional view of another photoelectric conversion element array according to Embodiment 6 of the present invention.

FIG. 15A is a sectional view of a photoelectric conversion element array where the potential of the lower electrode 4 is made common among every photoelectric conversion element, and the read circuit is formed on the surface side of the light-receiving section 1, to detect a voltage of the light-receiving section 1. The photoelectric conversion elements are arranged in an array form as shown in FIG. 11. The plurality of lower electrodes 4 are connected to one another by wiring, and have a common potential. As thus described, making the potential of the lower electrode 4 common and forming the read circuit on the light-receiving section 1 side facilitates formation of the circuit as compared with the case where the read circuit is formed on the undersurface of the lower electrode 4.

Figure 15B:
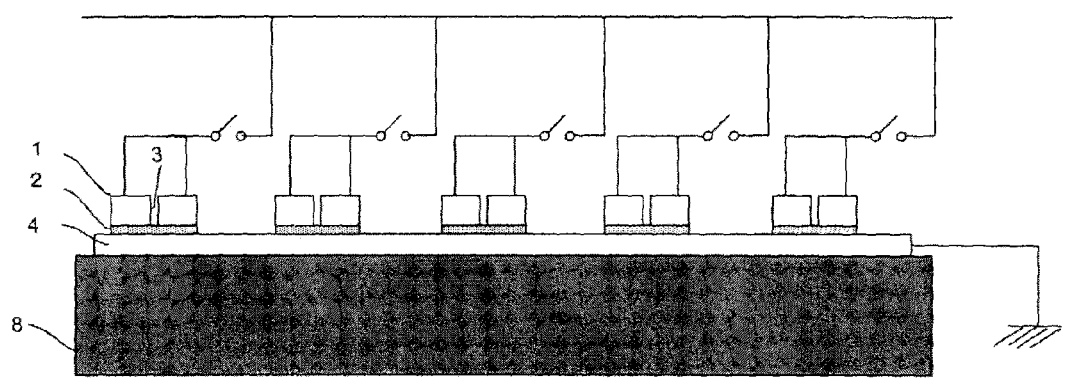
FIG. 15B is a sectional view of another photoelectric conversion element array according to Embodiment 6 of the present invention.

FIG. 15B is a sectional view of the photoelectric conversion element array where the potential of the lower electrode 4 is made common among every photoelectric conversion element, and the read circuit is formed on the surface side of the light-receiving section 1, to detect a voltage of the light-receiving section 1. Differently from the structure of FIG. 15A where the lower electrodes 4 of the plurality of photoelectric conversion elements are connected by wiring, the lower electrodes 4 of the plurality of photoelectric conversion elements are formed of a unitary lower electrode 4 and are thus made physically common. The read circuit provided on the light-receiving section 1 side has a similar structure as that of FIG. 15A. Making the lower electrode 4 physically common can simplify a step of processing the lower electrode 4, and also facilitates setting of the common potential.

As thus described, arranging the photoelectric conversion element 100 in the array form and providing the read circuit can individually extract an electrical signal output from each of the photoelectric conversion elements arranged in the horizontal and vertical directions, and can read an electrical signal detected in each photoelectric conversion element 100. This can lead to applications for example as an image sensor, position detecting, multi-wavelength detecting, and the like.

It is to be noted that, although the case of arranging the photoelectric conversion elements 100 in the array form has been described here, the other photoelectric conversion elements 200, 300, 400, 500 may be arranged in the array form.

As described above, arranging each of the photoelectric conversion elements according to Embodiments 1 to 5 of the present invention as one unit (pixel) in the array form can lead to applications as the image sensor, position detecting, multi-wavelength detecting, and the like. Since one pixel may include the slit 3 with a width w of several hundred nm, it is possible to make the pixel much smaller in size than a conventional pixel whose one side is several μm, thus leading to improvement in optical resolution and integration density.

Particularly in the conventional photoelectric conversion element described in Unexamined Japanese Patent Publication No. H8-264821, as described above, surface plasmons are not generated with respect to vertical incident light (incident light θ=0), and hence the element has especially been unusable as an image sensor on which the vertical incident light is mainly incident. As opposed to this, in each of the photoelectric conversion elements according to Embodiments 1 to 5 of the present invention, surface plasmons can be generated even with respect to vertical incident light, and hence the element is usable as the image sensor as in FIG. 12. Further, the slit 3 is provided, to generate surface plasmons on the insulating layer 2 not exposed to the surface, and the intensity thereof is detected as an electrical signal, thereby allowing improvement in S/N ratio while the electric field of the incident light on the surface of the light-receiving section 1 does not become noise.

Embodiment 7

Figure 16:
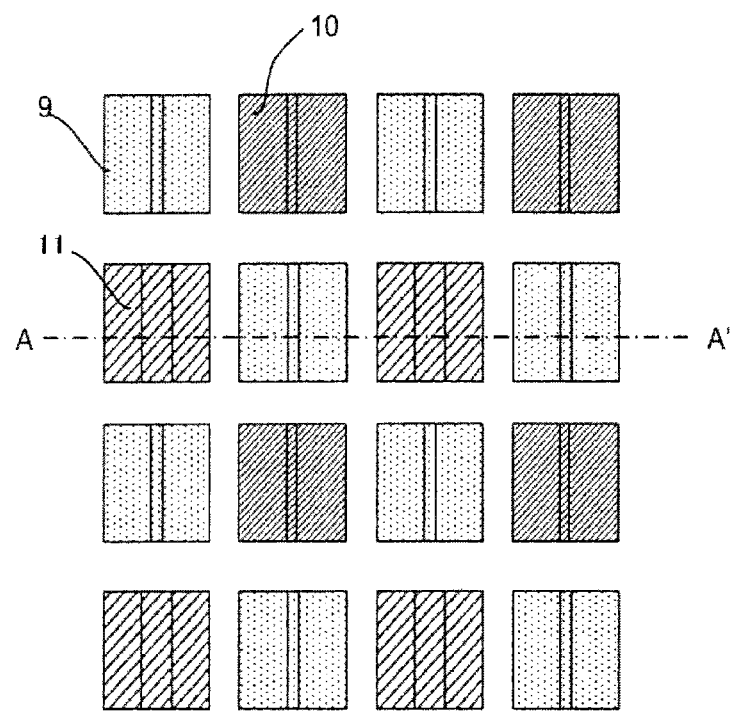
FIG. 16 is a plan view of a photoelectric conversion element array according to Embodiment 7 of the present invention.
Figure 17:
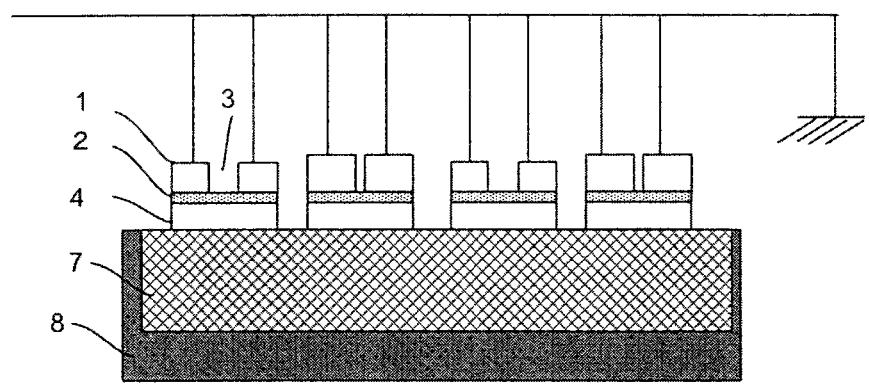
FIG. 17 is a sectional view of the photoelectric conversion element array according to Embodiment 7 of the present invention.

FIG. 16 is a top view of a photoelectric conversion element array where photoelectric conversion elements are arranged in the matrix form (only the photoelectric conversion elements are shown). FIG. 17 is a sectional view along A-A' of the photoelectric conversion element array of FIG. 16, where a read circuit is arranged below the lower electrode 4 as in Embodiment 6.

The photoelectric conversion element array includes three kinds of photoelectric conversion elements (corresponding to pixels of an image sensor) with different detection wavelengths, namely a photoelectric conversion element 9 with a detection wavelength λ1, a photoelectric conversion element 10 with a detection wavelength λ2 and a photoelectric conversion element 11 with a detection wavelength λ3. By changing one or more out of the width w and the height d of the slit 3 formed in the light-receiving section 1 and the thickness t of the insulating layer 2, the wavelength with high conversion efficiency to surface plasmons is changed, so that the detection wavelength of each of the photoelectric conversion elements can be selected. As shown in FIGS. 16 and 17, by providing the three kinds of photoelectric conversion elements 9, 10, 11, the photoelectric conversion element array having optical resolution with three kinds of wavelengths can be obtained. Although the case of providing the three kinds of photoelectric conversion elements 9, 10, 11 is shown in FIG. 16, two or more kinds of photoelectric conversion elements can be provided. The detecting section 5 and the method for reading an electrical signal in each photoelectric conversion element are the same as those in Embodiment 6.

As thus described, changing the shape (width w and depth d) of the slit 3 and the thickness t of the insulating layer 2 in the photoelectric conversion element (pixel) allows resolution (selection) of the detection wavelength. Hence it is possible to control the detection wavelength of each photoelectric conversion element only by changing the structure of the photoelectric conversion element, while not requiring a periodic structure or the like of the surface of a filter, a detector surface or the like for selecting the wavelength.

Arranging a plurality of photoelectric conversion elements (pixels) with different detection wavelengths in the array form and connecting respective circuits for reading electrical signals, as thus described, allows colorization of the image sensor. In the visible light region, the detection wavelengths are set to red, green and blue corresponding to RGB so that a color image can be obtained.

Further, when metal with high reflectivity in the infrared wavelength region such as gold or silver is used as the material for the light-receiving section 1 and the lower electrode 4, there is no absorption in the light-receiving section, and hence the detection wavelength is decided only by the structure of the slit 3. On the other hand, when a dielectric substance is for example used for the light-receiving section (absorber), since absorption of the material itself is reflected to the detection wavelength and becomes noise, a filter for preventing absorption in the light-receiving section, or the like, is required. As thus described, in the photoelectric conversion element of the present invention, the metal material that induces surface plasmon conversion is hardly absorbed in the infrared wavelength region, thereby eliminating the need of an absorption preventive structure such as a filter, to allow downsizing of the photoelectric conversion element.

What is claimed is:

1. A photoelectric conversion element which converts incident light to an electrical signal and detects the signal, the element comprising:

a lower electrode;

an insulating layer, provided on the lower electrode;

a light-receiving section, which is provided on the insulating layer and receives incident light on the surface; and a groove-like slit, provided such that the insulating layer is exposed from a surface of the light-receiving section, wherein the incident light is converted by the slit to surface plasmons which are wave-guided along the insulating layer, and the surface plasmon is detected as an electrical signal between the light-receiving section and the lower electrode.

2. The photoelectric conversion element according to claim 1, wherein a front surface and a rear surface of the insulating layer are flat.

3. The photoelectric conversion element according to claim 1, wherein a bottom surface of the slit reaches an inside of the insulating layer or the lower electrode.

4. The photoelectric conversion element according to claim 1, wherein an inside of the slit is filled with a dielectric material or an insulating material.

5. The photoelectric conversion element according to claim 1, wherein the slit is made up of two slits which are orthogonal to each other on the surface of the light-receiving section.

6. The photoelectric conversion element according to claim 1, wherein a cross section of the slit vertical to the surface of the light-receiving section is a rectangular shape or a V-shape, or a side wall of the slit is a convex curved surface toward the inside of the slit.

7. The photoelectric conversion element according to claim 1, wherein the light-receiving section includes a groove-like reflective slit which is provided to be parallel to the slit while having such a depth that the insulating layer is not exposed from the surface of the light-receiving section.

8. The photoelectric conversion element according to claim 7, wherein the plurality of reflective slits are provided at regular intervals on both sides of the slit.

9. The photoelectric conversion element according to claim 7, wherein the plurality of reflective slits are provided on both sides of the slit such that an interval increases with distance from the slit.

10. The photoelectric conversion element according to claim 1, wherein one of the light-receiving section and the lower electrode is connected to a reference potential, the other is connected to an integration circuit, and the surface plasmons are read as an electrical signal by the integrating circuit.

11. The photoelectric conversion element according to claim 1, wherein a bias voltage is applied to between the light-receiving section and the lower electrode.

12. The photoelectric conversion element according to claim 1, wherein a bottom surface of the lower electrode is flat.

13. A photoelectric conversion element array, wherein
a plurality of photoelectric conversion elements according to claim 1 are arranged in a matrix form, and
the electrical signal detected from the photoelectric conversion element is read by a read circuit.

14. The photoelectric conversion element array according to claim 13, wherein the photoelectric conversion elements which are different from one another in at least one out of a width and a depth of the slit and a thickness of the insulating layer in the photoelectric conversion element.

15. The photoelectric conversion element array according to claim 13, wherein
a potential of the light-receiving section is maintained to be a common potential, and
the read circuit is connected to the lower electrode.

16. The photoelectric conversion element array according to claim 13, wherein
the read circuit is connected to the light-receiving section, and
a potential of the lower electrode is maintained to be a common potential.

17. The photoelectric conversion element array according to claim 16, wherein in the plurality of photoelectric conversion elements, the lower electrodes are made up of a unitary electrode.

* * * * *